(12) United States Patent
Dong et al.

(10) Patent No.: US 12,542,382 B2
(45) Date of Patent: Feb. 3, 2026

(54) ELECTRICAL CONNECTION ASSEMBLY AND ELECTRICAL CONNECTION DEVICE

(71) Applicant: Tyco Electronics (Shanghai) Co., Ltd., Shanghai (CN)

(72) Inventors: Litao Dong, Shanghai (CN); Xiao (Nichee) Zhou, Shanghai (CN); Ziwei (Vivi) Li, Shanghai (CN); Yu Zhang, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 335 days.

(21) Appl. No.: 18/242,677

(22) Filed: Sep. 6, 2023

(65) Prior Publication Data

US 2024/0079802 A1 Mar. 7, 2024

(30) Foreign Application Priority Data

Sep. 6, 2022 (CN) .......................... 202211082509.6

(51) Int. Cl.
| | |
|---|---|
| H01R 12/58 | (2011.01) |
| H01R 12/70 | (2011.01) |
| H01R 12/72 | (2011.01) |
| H01R 12/73 | (2011.01) |
| H05K 1/14 | (2006.01) |

(52) U.S. Cl.
CPC ....... *H01R 12/585* (2013.01); *H01R 12/7064* (2013.01); *H01R 12/707* (2013.01); *H01R 12/727* (2013.01); *H01R 12/732* (2013.01); *H05K 1/141* (2013.01)

(58) Field of Classification Search
CPC .............. H01R 12/585; H01R 12/7064; H01R 12/707; H01R 12/727; H01R 12/732; H05K 1/141
USPC ....................................................... 174/250
See application file for complete search history.

(56) References Cited

U.S. PATENT DOCUMENTS

2014/0160704 A1 * 6/2014 Janssen ................ H05K 7/1417
361/759
2019/0296102 A1 * 9/2019 Tain ......................... H10D 1/68

* cited by examiner

*Primary Examiner* — Andargie M Aychillhum
(74) *Attorney, Agent, or Firm* — Barley Snyder

(57) ABSTRACT

An electrical connection assembly includes a first insulator, a first adapter circuit board defining a first hole, a first connection terminal fixed to the first insulator, and a flexible connection member. The first connection terminal includes a first press fitting part pressed into the first hole of the first adapter circuit board and electrically connected to the first adapter circuit board, and a second press fitting part protruding from the first insulator and adapted to be pressed into a second hole of a first circuit board to be electrically connected to the first circuit board. The flexible connection member includes a connection conductor electrically connected to the first adapter circuit board.

20 Claims, 9 Drawing Sheets

ELECTRICAL CONNECTION ASSEMBLY AND ELECTRICAL CONNECTION DEVICE

CROSS-REFERENCE TO RELATED APPLICATION

This application claims the benefit of Chinese Patent Application No. CN202211082509.6 filed on Sep. 6, 2022, in the State Intellectual Property Office of China, the whole disclosure of which is incorporated herein by reference.

FIELD OF THE INVENTION

The present invention relates to an electrical connection assembly and an electrical connection device comprising the electrical connection assembly.

BACKGROUND

In the prior art, electrical connections between circuit boards may be realized via electrical connectors, such as a board end connector on the circuit board and a cable end connector on the cable mated thereto. However, this solution requires the provision of two board end connectors and two cable end connectors, resulting in higher costs. Another solution for connecting circuit boards includes the use of a flexible flat cable (FFC) or flexible printed circuit board (FPC), which is directly soldered to the circuit board. However, welding of FFCs or FPCs is relatively difficult.

SUMMARY

According to an embodiment of the present disclosure, an electrical connection assembly includes a first insulator, a first adapter circuit board defining a first hole, a first connection terminal fixed to the first insulator, and a flexible connection member. The first connection terminal includes a first press fitting part pressed into the first hole of the first adapter circuit board and electrically connected to the first adapter circuit board, and a second press fitting part protruding from the first insulator and adapted to be pressed into a second hole of a first circuit board to be electrically connected to the first circuit board. The flexible connection member includes a connection conductor electrically connected to the first adapter circuit board.

BRIEF DESCRIPTION OF THE DRAWINGS

The invention will now be described by way of example with reference to the accompanying Figures, of which.

DETAILED DESCRIPTION OF THE EMBODIMENTS

Figure 1:
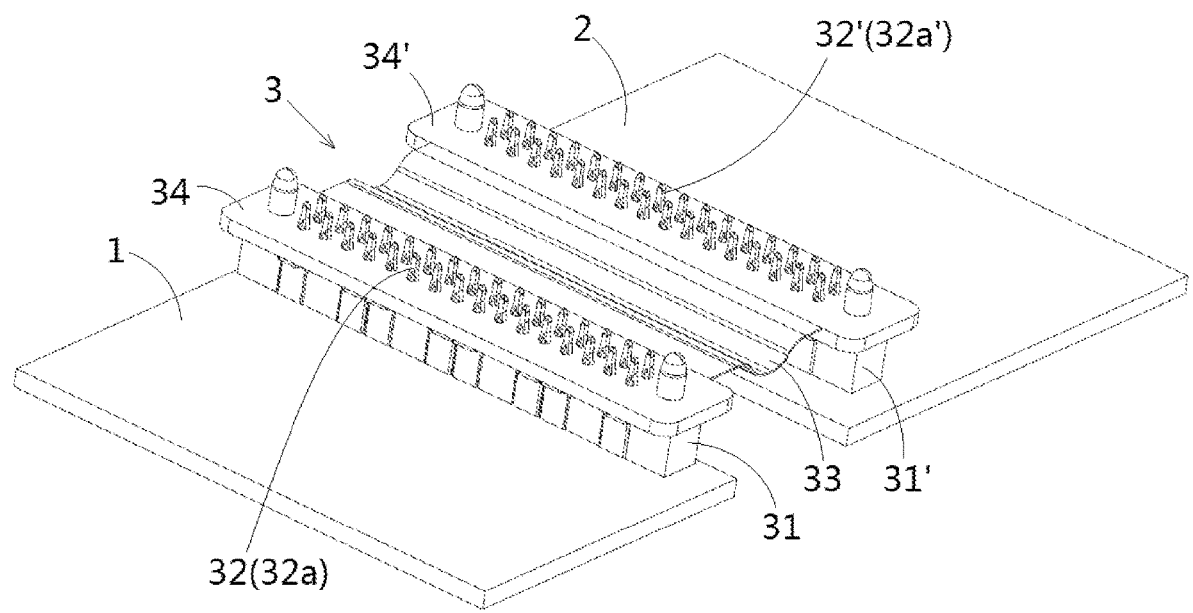
FIG. 1 is an illustrative perspective view of an electrical connection device according to an exemplary embodiment of the present invention when viewed from the top.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the present invention, an electrical connection assembly includes a first insulator, a first connection terminal fixed to the first insulator, a first adapter circuit board into which a first hole is formed, and a flexible connection member. The first connection terminal includes a first press fitting part and a second press fitting part protruding from the first insulator. The flexible connection member includes a connection conductor electrically connected to the first adapter circuit board. The first press fitting part of the terminal is pressed into the first hole of the first adapter circuit board to be electrically connected to the first adapter circuit board. The second press fitting part of the terminal is adapted to be pressed into a second hole of a first circuit board to be electrically connected to the first circuit board.

According to another embodiment of the present disclosure, an electrical connection device includes the above-described electrical connection assembly, and a first circuit board formed with a second hole. The second press fitting part of the first connection terminal of the electrical connection assembly is pressed into the second hole of the first circuit board.

Figure 2:
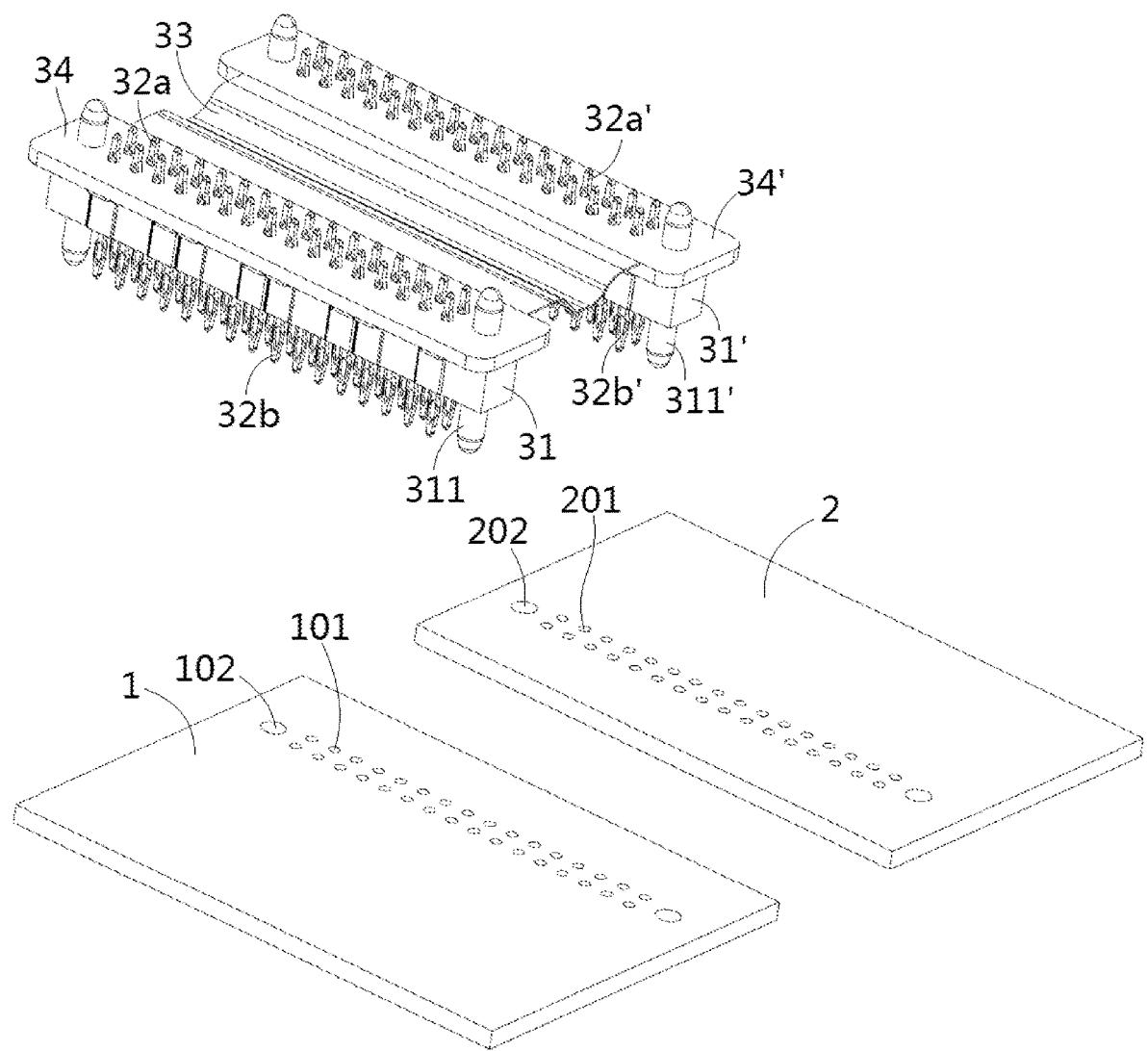
FIG. 2 is an illustrative exploded view of an electrical connection device according to an exemplary embodiment of the present invention when viewed from the top.
Figure 3:
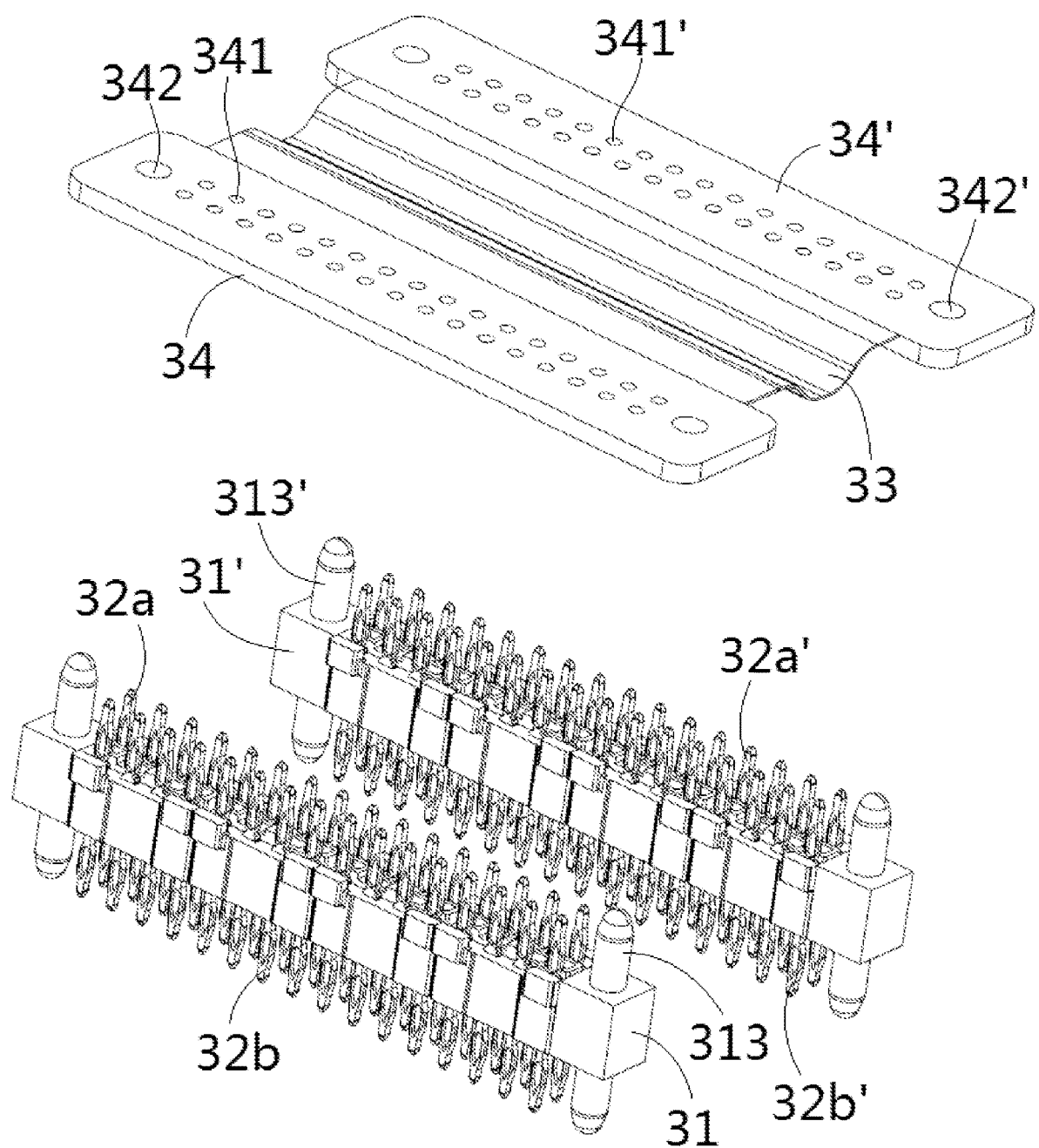
FIG. 3 is an illustrative exploded view of an electrical connection assembly according to an exemplary embodiment of the present invention when viewed from the top.
Figure 4:
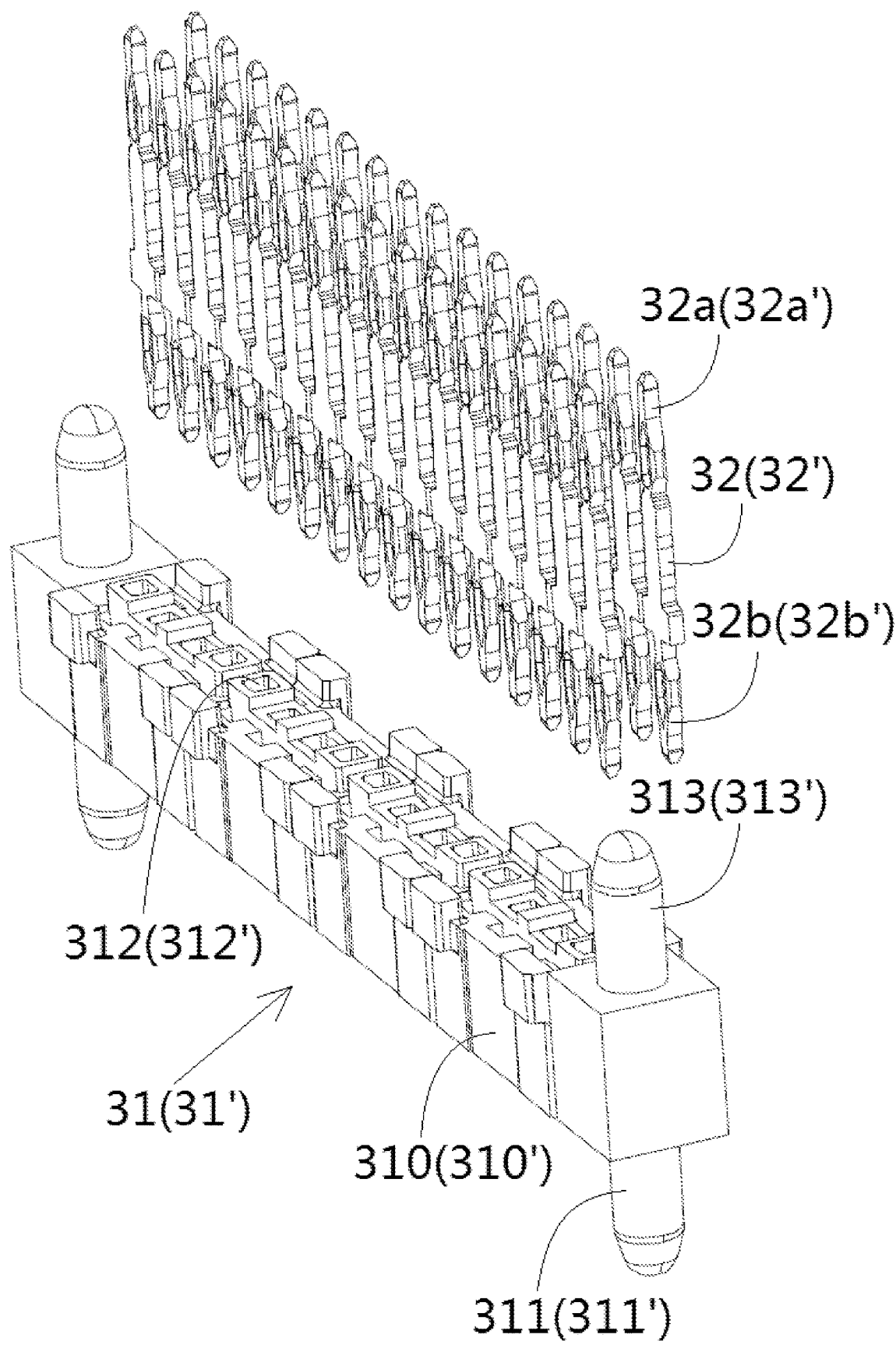
FIG. 4 is an illustrative exploded view of an insulator and connection terminal of an electrical connection assembly according to an exemplary embodiment of the present invention.
Figure 5:
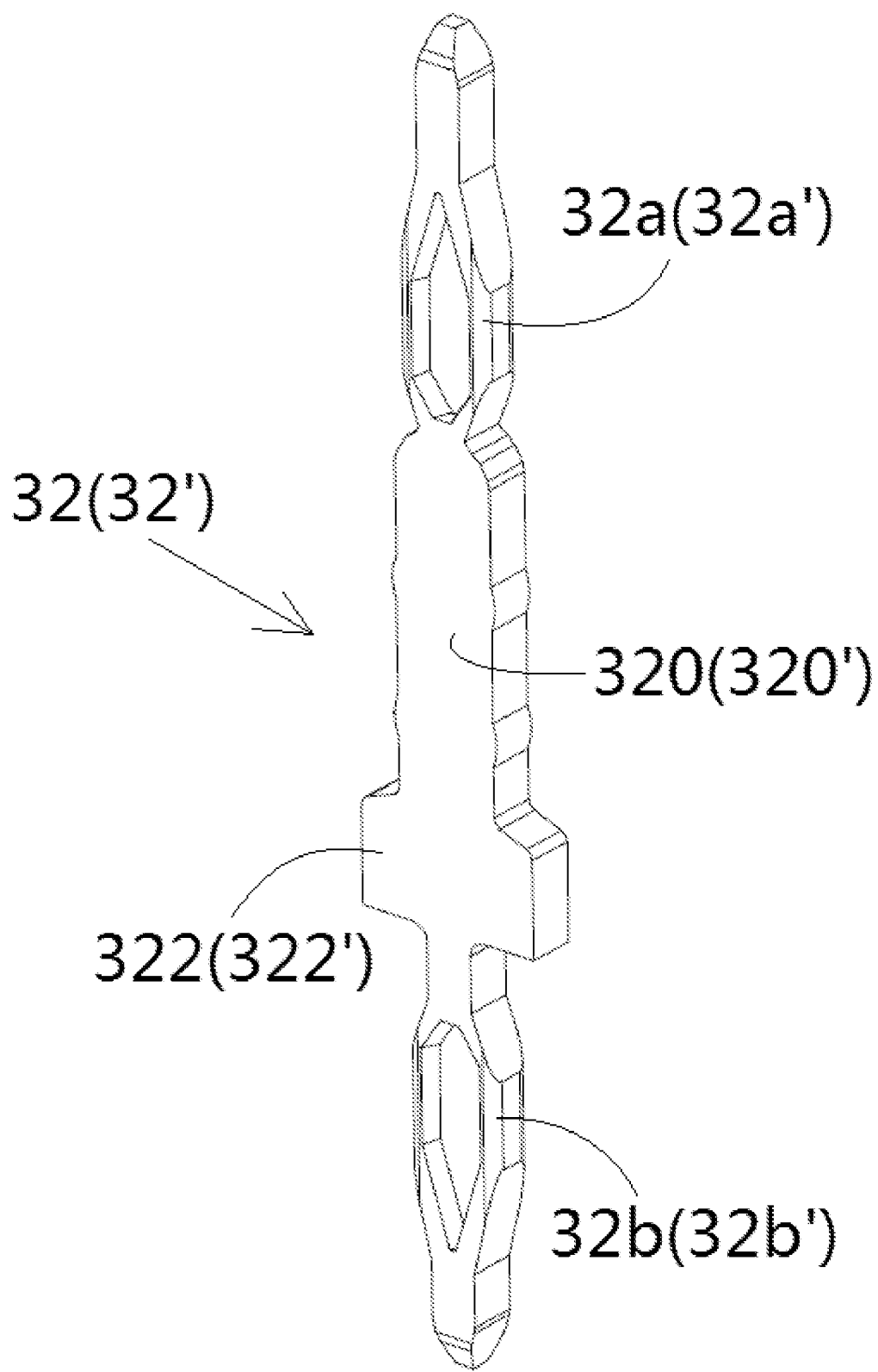
FIG. 5 is an illustrative perspective view of a connection terminal of an electrical connection assembly according to an exemplary embodiment of the present invention.

FIG. 1 is an illustrative perspective view of an electrical connection device according to an exemplary embodiment of the present invention when viewed from the top. FIG. 2 is an illustrative exploded view of the electrical connection device according to an exemplary embodiment of the present invention when viewed from the top. FIG. 3 is an illustrative exploded view of the electrical connection assembly 3 according to an exemplary embodiment of the present invention when viewed from the top. FIG. 4 is an illustrative exploded view of the insulators 31, 31' and connection terminals 32, 32' of the electrical connection assembly 3 according to an exemplary embodiment of the present invention. FIG. 5 is an illustrative perspective view of the connection terminals 32, 32' of the electrical connection assembly 3 according to an exemplary embodiment of the present invention.

As shown in FIGS. 1-5, in an exemplary embodiment of the present invention, an electrical connection device is disclosed. The electrical connection device includes a first circuit board 1, a second circuit board 2, and an electrical connection assembly 3. The electrical connection assembly 3 is electrically connected to the first circuit board 1 and the second circuit board 2.

In an exemplary embodiment of the present invention, the electrical connection assembly 3 includes a first insulator 31, a first connection terminal 32, a flexible connection member 33, and a first adapter circuit board 34. The first connection terminal 32 is fixed to the first insulator 31 and includes a first press fitting part 32a and a second press fitting part 32b extending from the first insulator. A first hole 341 is formed in the first adapter circuit board 34. The flexible connection member 33 includes a connection conductor (not shown) electrically connected to the first adapter circuit board 34. The first press fitting part 32a is pressed into the first hole 341 of the first adapter circuit board 34 and electrically connected to the first adapter circuit board. The second press fitting part 32b is adapted to be pressed into the second hole 101 of the first circuit board 1 to be electrically connected to the first circuit board. Pressure fitting is a type of welding free connection, therefore, compared to welding, a pressure fitting operation has the advantages of simplicity and speed. In the exemplary embodiment, the flexible connection member 33 can be a flexible flat cable (FFC) or a flexible printed circuit board (FPC).

Still referring to FIGS. 1-5, the first insulator 31 includes a first body part 310 and a first slot 312. The first slot 312 is formed on the first body part 310. The first connection terminal 32 is installed in the first slot 312, and the first press fitting part 32a and the second press fitting part 32b protrude from the first slot.

The first connection terminal 32 further includes a first connection body 320 and a first fixing part 322. The first connection body 320 is at least partially accommodated in the first slot 312. The first fixing part 322 is connected to one end of the first connection body 320 and is fixed in the first slot 312. One of the first press fitting part 32a and the second press fitting part 32b is connected to the first fixing part 322, and the other is connected to the other end of the first connection body 320. The first connection terminal 32 extends vertically, with the first press fitting part 32a and the second press fitting part 32b located at the upper and lower ends of the first connection terminal, respectively.

A first positioning hole 342 is formed in the first adapter circuit board 34. The first insulator 31 also includes a first positioning post 313 and a second positioning post 311. The first positioning post 313 is formed on the top surface of the first main body part 310 for insertion into the first positioning hole 342 of the first adapter circuit board 34. The second positioning post 311 is formed on the bottom surface of the first body part 310 for insertion into the second positioning hole 102 of the first circuit board 1.

As shown in FIGS. 1 to 5, in the illustrated embodiment, the first connection terminal 32 is an integral stamped terminal. Further, the first insulator 31 and the first connection terminal 32 are two independent components separated from each other, and the first connection terminal is installed in the first slot 312 on the first insulator. However, the present invention is not limited to the illustrated embodiments. For example, the first insulator 31 can be an injection molded part formed on the first connection terminal 32, so that the first insulator and the first connection terminal are formed into an integral piece.

The electrical connection assembly includes at least one row of first connection terminals 32 and one flexible connection member 33. The one flexible connection member 33 includes a row of connection conductors. One ends of a row of connection conductors of the flexible connection member 33 are electrically connected to the first adapter circuit board 34 to be electrically connected to at least one row of first connection terminals 32 via the first adapter circuit board.

The electrical connection assembly 3 further includes a second insulator 31', a second connection terminal 32', and a second adapter circuit board 34'. The second connection terminal 32' is fixed to the second insulator 31' and includes a third press fitting part 32a' and a fourth press fitting part 32b' protruding from the second insulator. A third hole 341' is formed in the second adapter circuit board 34'. The connection conductor of the flexible connection member 33 is electrically connected to the second adapter circuit board 34'. The third press fitting part 32a' is pressed into the third hole 341' of the second adapter circuit board 34' to be electrically connected to the second adapter circuit board. The fourth press fitting part 32b' is adapted to be pressed into a fourth hole 201 of a second circuit board 2 to be electrically connected to the second circuit board.

The electrical connection assembly 3 includes at least one row of second connection terminals 32' and one flexible connection member 33. The one flexible connection member 33 includes a row of connection conductors. The other ends of a row of connection conductors of the flexible connection member 33 are electrically connected to the second adapter circuit board 34' to be electrically connected to at least one row of second connection terminals 32' via the second adapter circuit board.

According to one embodiment, the first press fitting part 32a and the second press fitting part 32b of the first connection terminal 32, as well as the third press fitting part 32a' and the fourth press fitting part 32b' of the second connection terminal 32', are in a fisheye shape.

The second insulator 31' is identical to the first insulator 31, allowing for their interchangeable use. The second connection terminal 32' is identical to the first connection terminal 32, allowing them to be interchangeable. The second adapter circuit board 34' is identical to the first adapter circuit board 34, also allowing for their interchangeable use.

The second insulator 31' includes a second body part 310' and a third slot 312'. The third slot 312' is formed on the second body part 310'. The second connection terminal 32' is installed in the third slot 312', and the third press fitting part 32a' and the fourth press fitting part 32b' protrude from the third slot. The second connection terminal 32' further includes a second connection body 320' and a second fixing part 322'. The second connection body 320' is accommodated in the third slot 312'. The second fixing part 322' is connected to one end of the second connection body 320' and is fixed in the third slot 312'. One of the third press fitting part 32a' and the fourth press fitting part 32b' is connected to the second fixing part 322', and the other is connected to the other end of the second connection body 320'. In the illustrated embodiment, the second connection terminal 32' extends vertically, and the third press fitting part 32a' and the fourth press fitting part 32b' are respectively located at the upper and lower ends of the second connection terminal 32'.

A third positioning hole 342' is formed in the second adapter circuit board 34'. The second insulator 31' also includes a third positioning post 313' and a fourth positioning post 311'. The third positioning post 313' protrudes from the top surface of the second body part 310' and is used for inserting into the third positioning hole 342' of the second adapter circuit board 34'. The fourth positioning post 311' protrudes from the bottom surface of the second body part 310' and is used for inserting into the fourth positioning hole 202 of the second circuit board 2.

As shown in FIGS. 1 to 5, in the illustrated embodiment, the second connection terminal 32' is an integral stamped terminal. The second insulator 31' and the second connection terminal 32' are two independent components separated from each other, and the second connection terminal 32' is installed in the third slot 312' on the second insulator. However, the present invention is not limited to the illustrated embodiments, for example, the second insulator 31' can be an injection molded part formed on the second connection terminal 32', so that the second insulator 31' and the second connection terminal 32' are formed into an integral piece.

In another exemplary embodiment of the present invention, an electrical connection device is also disclosed. The electrical connection device includes the aforementioned electrical connection assembly 3 and a first circuit board 1. A second hole 101 is formed in the first circuit board 1. The second press fitting part 32b of the first connection terminal 32 of the electrical connection assembly 3 is pressed into the second hole 101 of the first circuit board 1.

The electrical connection device 3 also includes a second circuit board 2. A fourth hole 201 is formed in the second circuit board 2. The fourth press fitting part 32b' of the second connection terminal 32' of the electrical connection assembly 3 is pressed into the fourth hole 201 of the second circuit board 2. The two ends of the connection conductor of the flexible connection member 33 can be welded to the first and second adapter circuit boards 34' respectively, to be electrically connected to the first and second adapter circuit boards.

Figure 6:
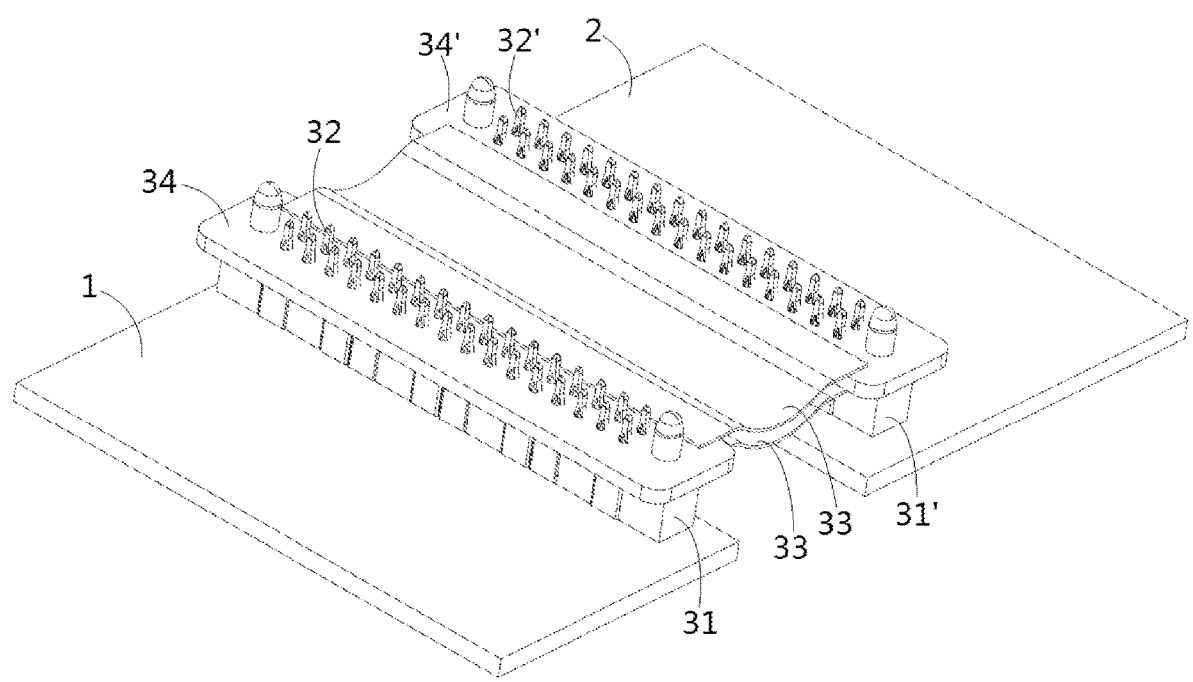
FIG. 6 is an illustrative perspective view of an electrical connection device according to another exemplary embodiment of the present invention when viewed from the top.

FIG. 6 is an illustrative perspective view of an electrical connection device according to another exemplary embodiment of the present invention when viewed from the top. The main difference between the electrical connection device shown in FIG. 6 and the electrical connection device shown in FIGS. 1-5 is the number of flexible connection members 33. In the embodiments shown in FIGS. 1-5, the electrical connection assembly 3 only includes one flexible connection member 33. In the embodiment shown in FIG. 6, the electrical connection assembly 3 includes multiple flexible connection members 33 stacked up and down, each of which includes a row of connection conductors. One ends of the connection conductors of multiple flexible connection members 33 are electrically connected to the first adapter circuit board 34 to be electrically connected to at least one row of first connection terminals 32 via the first adapter circuit board. The other ends of the connection conductors of multiple flexible connection members 33 are electrically connected to the second adapter circuit board 34' to be electrically connected to at least one row of second connection terminals 32' via the second adapter circuit board.

In the illustrated embodiment, the electrical connection assembly 3 includes two flexible connection members 33 stacked up and down. One ends of the connection conductors of the two flexible connection members 33 are respectively welded to the top and bottom surfaces of the first adapter circuit board 34, and the other ends are welded to the top and bottom surfaces of the second adapter circuit board 34', respectively.

Figure 7:
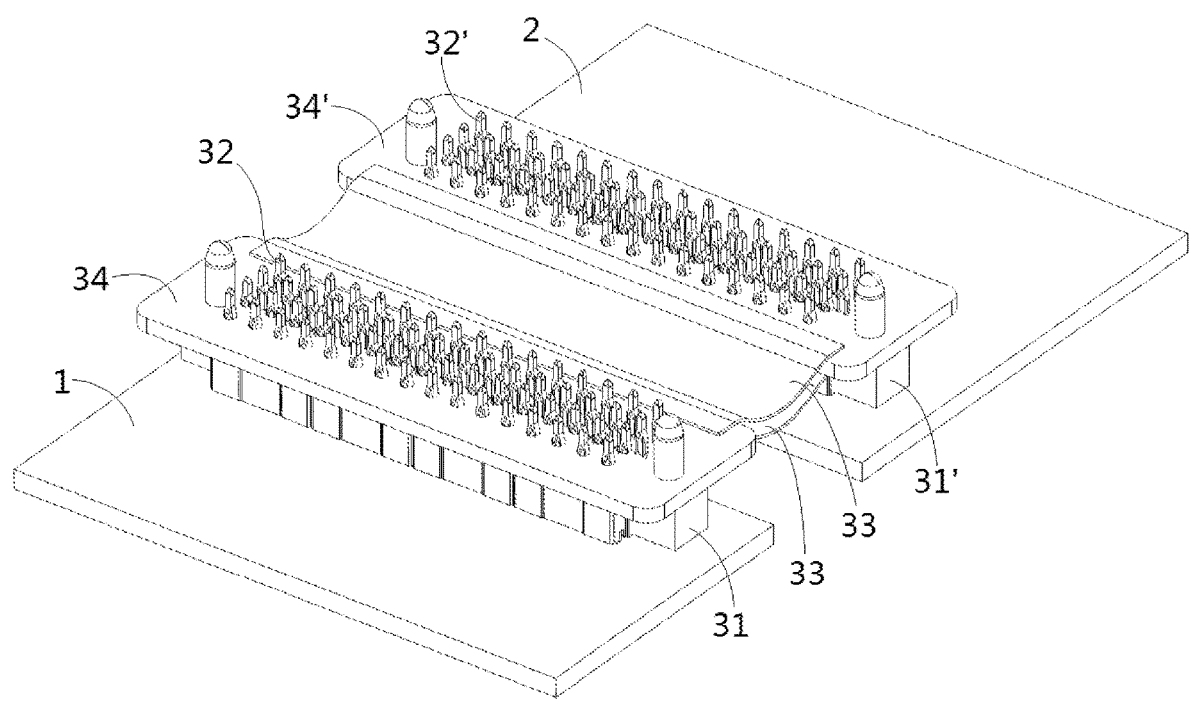
FIG. 7 is an illustrative perspective view of an electrical connection device according to another exemplary embodiment of the present invention when viewed from the top.

FIG. 7 is an illustrative perspective view of an electrical connection device according to another exemplary embodiment of the present invention when viewed from the top. The main difference between the electrical connection device shown in FIG. 7 and the electrical connection device shown in FIG. 6 is the number of first connection terminals 32 and second connection terminals 32'. In the embodiment shown in FIG. 6, the electrical connection assembly 3 includes two rows of first connection terminals 32 and two rows of second connection terminals 32'. In the embodiment shown in FIG. 7, the electrical connection assembly 3 includes four rows of first connection terminals 32 and four rows of second connection terminals 32'.

Figure 8:
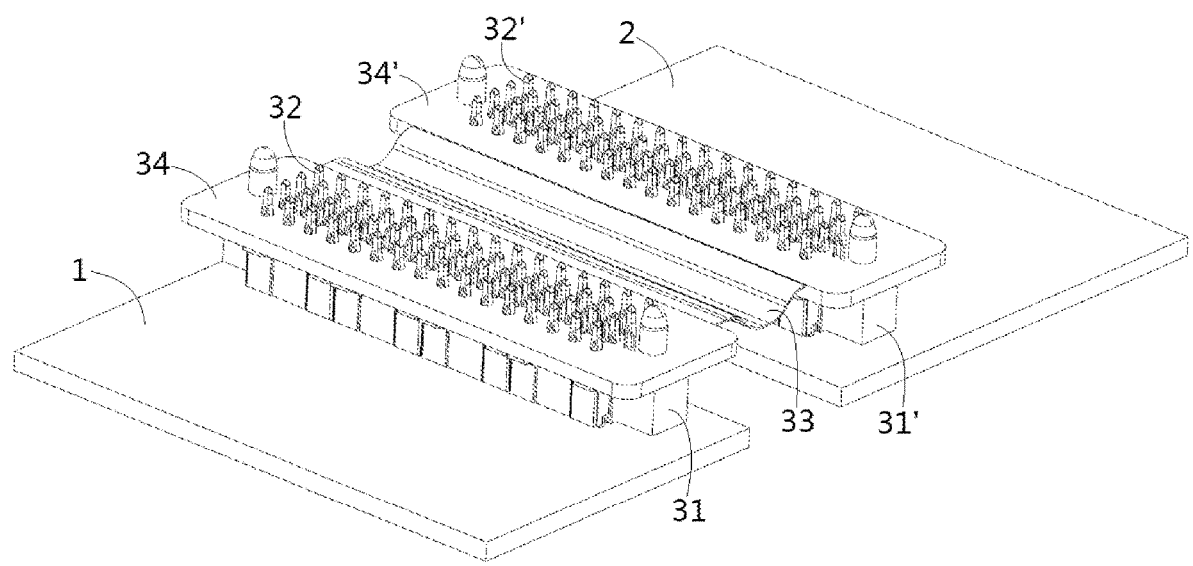
FIG. 8 is an illustrative perspective view of an electrical connection device according to another exemplary embodiment of the present invention when viewed from the top.

FIG. 8 is an illustrative perspective view of an electrical connection device according to another exemplary embodiment of the present invention when viewed from the top. The main difference between the electrical connection device shown in FIG. 8 and the electrical connection device shown in FIG. 7 is the number of flexible connection members 33. In the embodiment shown in FIG. 7, the electrical connection assembly 3 includes two flexible connection members 33 stacked up and down. In the embodiment shown in FIG. 8, the electrical connection assembly 3 only includes one flexible connection member 33.

Figure 9:
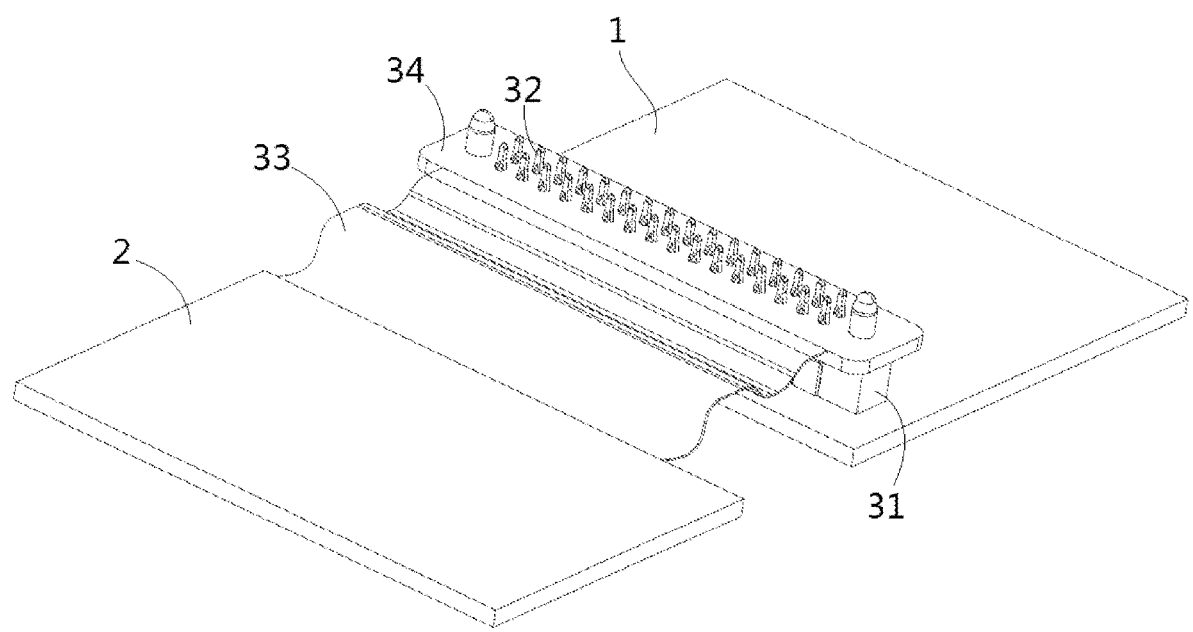
FIG. 9 is an illustrative perspective view of an electrical connection device according to another exemplary embodiment of the present invention when viewed from the top.

FIG. 9 is an illustrative perspective view of an electrical connection device according to another exemplary embodiment of the present invention when viewed from the top. The main difference between the electrical connection device shown in FIG. 9 and the electrical connection device shown in FIGS. 1-5 is the removal of the second insulator 31', the second connection terminal 32', and the second adapter circuit board 34'. As shown in FIG. 9, in the illustrated embodiment, the other end of the connection conductor of the flexible connection member 33 is directly electrically connected to the second circuit board 2. Compared with the embodiments shown in FIGS. 1-8, the electrical connection assembly 3 shown in FIG. 9 can omit the second insulator 31', the second connection terminal 32', and the second adapter circuit board 34'.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. An electrical connection assembly, comprising:
   a first insulator;
   a first adapter circuit board defining a first hole;
   a first connection terminal fixed to the first insulator, and including:
      a first press fitting part pressed into the first hole of the first adapter circuit board and electrically connected to the first adapter circuit board; and
      a second press fitting part protruding from the first insulator and adapted to be pressed into a second hole of a first circuit board to be electrically connected to the first circuit board; and
   a flexible connection member including a connection conductor electrically connected to the first adapter circuit board.

2. The electrical connection assembly according to claim 1, wherein the flexible connection member is a flexible flat cable or a flexible printed circuit board.

3. The electrical connection assembly according to claim 1, wherein the first insulator includes:
   a first body part; and
   a first slot formed on the first body part, the first connection terminal arranged within the first slot, and the first press fitting part and the second press fitting part protrude from the first slot.

4. The electrical connection assembly according to claim 3, wherein the first connection terminal further includes:
   a first connection body at least partially accommodated in the first slot; and
   a first fixing connected to one end of the first connection body and fixed within the first slot, one of the first press fitting part and the second press fitting part is connected to the first fixing part, and the other of the first press fitting part and the second press fitting part is connected to the other end of the first connection body.

5. The electrical connection assembly according to claim 1, wherein the first press fitting part and the second press fitting part are respectively located at ends of the first connection terminal.

6. The electrical connection assembly according to claim 3, wherein a first positioning hole is formed in the first adapter circuit board, and the first insulator further includes at least one of:
   a first positioning post protruding from the top surface of the first body part for insertion into a first positioning hole of the first adapter circuit board; or
   a second positioning post protruding from the bottom surface of the first body part for insertion into a second positioning hole of the first circuit board.

7. The electrical connection assembly according to claim 1, wherein the first insulator is an injection molded part formed on the first connection terminal.

8. The electrical connection assembly according to claim 1, wherein:
   the electrical connection assembly comprises at least one row of first connection terminals and one flexible connection member;
   the flexible connection member comprises a row of connection conductors; and
   one end of a row of connection conductors of the flexible connection member are electrically connected to the first adapter circuit board to be electrically connected to at least one row of first connection terminals via the first adapter circuit board.

9. The electrical connection assembly according to claim 1, wherein:
   the electrical connection assembly includes at least one row of first connection terminals and multiple flexible connection members stacked up and down, each of the flexible connection members includes a row of connection conductors; and
   one end of the connection conductors of the multiple flexible connection members are electrically connected to the first adapter circuit board to be electrically connected to at least one row of first connection terminals via the first adapter circuit board.

10. The electrical connection assembly according to claim 1, further comprising:
    a second insulator;
    a second connection terminal which is fixed to the second insulator and includes a third press fitting part and a fourth press fitting part protruding from the second insulator; and
    a second adapter circuit board which is formed with a third hole, wherein:
       the connection conductor of the flexible connection member is electrically connected to the second adapter circuit board;
       the third press fitting part is pressed into the third hole of the second adapter circuit board to be electrically connected to the second adapter circuit board; and
       the fourth press fitting part is adapted to be pressed into a fourth hole of a second circuit board to be electrically connected to the second circuit board.

11. The electrical connection assembly according to claim 10, wherein:
    the electrical connection assembly includes at least one row of second connection terminals and one flexible connection member, the flexible connection member comprises a row of connection conductors; and
    the other ends of a row of connection conductors of the flexible connection member are electrically connected to the second adapter circuit board to be electrically connected to at least one row of second connection terminals via the second adapter circuit board.

12. The electrical connection assembly according to claim 10, wherein the electrical connection assembly includes at least one row of second connection terminals and multiple flexible connection members stacked up and down, each of the flexible connection members includes a row of connection conductors.

13. The electrical connection assembly according to claim 11, wherein the other ends of the connection conductors of the multiple flexible connection members are electrically connected to the second adapter circuit board to be electrically connected to at least one row of second connection terminals via the second adapter circuit board.

14. The electrical connection assembly according to claim 10, wherein the electrical connection assembly includes two flexible connection members stacked up and down, one ends of the connection conductors of the two flexible connection members are respectively welded to the top and bottom surfaces of the first adapter circuit board, and the other ends are respectively welded to the top and bottom surfaces of the second adapter circuit board.

15. The electrical connection assembly according to claim 10, wherein:
- the second insulator is identical to the first insulator, enabling the second insulator and the first insulator to be interchangeably used;
- the second connection terminal is identical to the first connection terminal, enabling the second connection terminal and the first connection terminal to be interchangeably used; and
- the second adapter circuit board is identical to the first adapter circuit board, enabling the second adapter circuit board and the first adapter circuit board to be interchangeably used.

16. The electrical connection assembly according to claim 1, wherein the other end of the connection conductor of the flexible connection member is adapted to be directly and electrically connected to a second circuit board.

17. An electrical connection device, comprising:
- an electrical connection assembly, including:
  - a first insulator;
  - a first adapter circuit board defining a first hole;
  - a first connection terminal fixed to the first insulator, and including:
    - a first press fitting part pressed into the first hole of the first adapter circuit board and electrically connected to the first adapter circuit board; and
    - a second press fitting part protruding from the first insulator; and
  - a flexible connection member including a connection conductor electrically connected to the first adapter circuit board; and
  - a first circuit board formed with a second hole, the second press fitting part of the first connection terminal pressed into the second hole of the first circuit board.

18. The electrical connection device according to claim 17, further comprising:
- a second insulator;
- a second connection terminal fixed to the second insulator and including a third press fitting part and a fourth press fitting part protruding from the second insulator; and
- a second adapter circuit board which is formed with a third hole, wherein:
  - the connection conductor of the flexible connection member is electrically connected to the second adapter circuit board; and
  - the third press fitting part is pressed into the third hole of the second adapter circuit board to be electrically connected to the second adapter circuit board.

19. The electrical connection device according to claim 18, further comprising a second circuit board formed with a fourth hole, the fourth press fitting part of the second connection terminal of the electrical connection assembly is pressed into the fourth hole of the second circuit board.

20. The electrical connection device according to claim 17, further comprising a second circuit board, wherein the connection conductor of the flexible connection member is directly and electrically connected to the second circuit board.

* * * * *